US010109288B2

(12) United States Patent
Baumgarte

(10) Patent No.: US 10,109,288 B2
(45) Date of Patent: Oct. 23, 2018

(54) DYNAMIC RANGE AND PEAK CONTROL IN AUDIO USING NONLINEAR FILTERS

(71) Applicant: Apple Inc., Cupertino, CA (US)

(72) Inventor: Frank M. Baumgarte, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/723,337

(22) Filed: May 27, 2015

(65) Prior Publication Data

US 2016/0351202 A1 Dec. 1, 2016

(51) Int. Cl.
*G10L 15/25* (2013.01)
*G10L 19/26* (2013.01)
*H03G 7/00* (2006.01)

(52) U.S. Cl.
CPC ............ *G10L 19/26* (2013.01); *H03G 7/007* (2013.01)

(58) Field of Classification Search
CPC .............................. G10L 19/008; G10L 19/26
USPC ........................................................ 704/500
See application file for complete search history.

(56) References Cited

U.S. PATENT DOCUMENTS

| 6,782,366 B1 | 8/2004 | Huang et al. |
| 7,489,788 B2 | 2/2009 | Leung et al. |
| 7,848,531 B1 | 12/2010 | Vickers et al. |
| 8,085,941 B2 | 11/2011 | Taenzer |
| 8,103,006 B2 | 1/2012 | McGrath |
| 8,199,933 B2 | 6/2012 | Seefeldt |
| 8,300,849 B2 | 10/2012 | Smirnov et al. |
| 8,428,270 B2 | 4/2013 | Crockett et al. |
| 8,437,480 B2 | 5/2013 | Zong et al. |
| 8,903,729 B2 | 12/2014 | Riedmiller et al. |
| 2007/0092089 A1* | 4/2007 | Seefeldt ............... G10L 25/48 381/104 |
| 2010/0083344 A1 | 4/2010 | Schildbach et al. |

(Continued)

FOREIGN PATENT DOCUMENTS

| JP | 2009296298 | 12/2009 |
| WO | WO-2011/141772 A1 | 11/2011 |

(Continued)

OTHER PUBLICATIONS

ISO/MPEG, "14496-12 PDAM 3—Enhanced Audio Support, CFile Format.", *Contribution M29150, 104th MPEG meeting*, Incheon Korea (Apr. 2013).

(Continued)

*Primary Examiner* — Bharatkumar S Shah
(74) *Attorney, Agent, or Firm* — Womble Bond Dickinson (us) LLP

(57) ABSTRACT

An audio encoding device is described herein. The audio encoding device includes a compressor that is based on a nonlinear filter. In particular, the nonlinear filter may be selected from the class of edge-preserving smoothing filters, which avoids common artifacts of conventional compressors. Edge-preserving smoothing filters have been used in image processing algorithms for their de-noising properties while preserving edges in the image. These properties are useful for audio compression because macro-dynamic loudness changes can be tracked precisely while micro-dynamic loudness changes can be ignored for the compression. Due to these advantages, more aggressive compression can be achieved with less distortion.

24 Claims, 15 Drawing Sheets

(56) References Cited

U.S. PATENT DOCUMENTS

| | | |
|---|---|---|
| 2010/0250258 A1 | 9/2010 | Smithers et al. |
| 2010/0310085 A1 | 12/2010 | Hyen-O et al. |
| 2011/0038490 A1* | 2/2011 | Yang ............... H03G 5/165 |
| | | 381/103 |
| 2011/0085677 A1 | 4/2011 | Walsh et al. |
| 2011/0208528 A1* | 8/2011 | Schildbach ........... G10L 19/008 |
| | | 704/500 |
| 2012/0224611 A1 | 9/2012 | Baheti et al. |
| 2012/0310654 A1 | 12/2012 | Riedmiller et al. |
| 2012/0321096 A1* | 12/2012 | Crockett ............. H03G 3/3089 |
| | | 381/57 |
| 2013/0156229 A1 | 6/2013 | Riedl |
| 2013/0322640 A1* | 12/2013 | Dickins ............... G10K 11/16 |
| | | 381/66 |
| 2013/0322666 A1 | 12/2013 | Yoo et al. |
| 2014/0369527 A1 | 12/2014 | Baldwin |

FOREIGN PATENT DOCUMENTS

| | | |
|---|---|---|
| WO | WO-2013/041875 A2 | 3/2013 |
| WO | WO-2013/068637 A1 | 5/2013 |
| WO | WO-2013/173080 A1 | 11/2013 |
| WO | WO-2014/046916 A1 | 3/2014 |

OTHER PUBLICATIONS

ISO/MPEG, "WD of AMD 1 to Coding-Independent Code Points (23001-8): Audio Code Points.", *106th MPEG Meeting*, Geneva Switzerland (Oct. 2013).

International telecommunications Union, ITU-R Radiocommunication Sector of ITU. "Algorithms to Measure Audio Programme Loudness and True-Peak Audio Level," Recommendation ITU-R BS.1770-3. Geneva, Switzerland (Aug. 2012). 24 pages.

Fraunhofer IIS. "White Paper HE-AAC Metadata for Digital Broadcasting." (Sep. 2011). 16 pages.

ATSC. "A/53:ATSC Digital Television Standard, Parts 1-6." Advanced Television Systems Committee, Inc. Washington, D.C. (Jan. 2007). 136 pages.

ATSC. "ATSC Recommended Practice: Techniques for Establishing and Maintaining Audio Loudness for Digital Television." Document A/85:2011. Advanced Television Systems Committee, Inc. Washington, D.C. (Jul. 2011). 76 pages.

ATSC. "ATSC Standard: Digital Audio Compression (AC-3, E-AC-3)." *Advanced Television Systems Committee. Doc. A/52:* 2012. Washington, D.C. (Dec. 2012). 270 pages.

Baumgarte, et al. "Working Draft on Dynamic Range Control." ISO/IEC JCT1/SC29/WG11 MPEG2013/N14067. Geneva, Switzerland (Nov. 2013). 32 pages.

Dolby Laboratories, Inc. "Dolby Metadata Guide." Issue 3, S05/14660/16797 (2005). 28 pages.

EBU-UER. "EBU Recommendation R 128 "Loudness Normalisation and Permitted Maximum Level of Audio Signals"", Geneva, Switzerland (Aug. 2011). 5 pages.

ETSI. "Digital Video Broadcasting (DVB); Specification for the Use of Video and Audio Coding in Broadcasting Applications Based on the MPEG-2 Transport Stream." ETSI TS 101 154 v1.11.1. European Telecommunication Standards Institute (2012); European Broadcasting Union (2012). 195 pages.

Giannoulis, D. "A Design of a Digital, Parameter-automated, Dynamic Range Compressor." MSC Project Report, Queen Mary University of London (Aug. 26, 2010). 92 pages.

ISO/IEC. "Coding of Moving Pictures and Audio." ISO/IEC 13818-7, International Standard (2003). 206 pages.

ISO/IEC. "Information Technology—Coding of Audio-Visual Objects—Part 3: Audio." ISO/IEC 14496-3, Subpart 4, International Standard (2009). 150 pages.

ISO/IEC. "ISO/IEC 14496-3:200X(E)." Fourth Edition, Switzerland (2009). 150 pages.

ISO/MPEG. "On ISO/IEC 14496-12 Technologies under Consideration: Enhanced Audio Support." Contribution M29150, 104th MPEG meeting, Incheon, Korea (Apr. 2013). 14 pages.

ISO/MPEG. "Enhanced Metadata for Dynamic Range Compression." Contribution M28901, 104th MPEG meeting. Incheon, Korea, (Apr. 2013). 10 pages.

ISO/MPEG. "Information Technology—MPEG Audio Technologies—Part 1: MPEG Surround." ISO/IEC FDIS 23003-1 (2006). 294 pages.

ISO/MPEG. "Information Technology—MPEG Audio Technologies—Part 2: Spatial Audio Object Coding." ISO/IEC FDIS 230003-2 (2010). 286 pages.

ISO/MPEG. "Timeline and Requirements for MPEG-H 3D Audio Version 1." ISO/IEC JTC1/SC29/WG11 N13855. Vienna, Austria (Aug. 2013). 3 pages.

ISO/MPEG. "Improved Audio Support in the ISO Base Media File Format." ISO/IEC JCT1/SC29/WG11, MPEG2013/m31470. Geneva, Switzerland (Oct. 23, 2013). 12 pages.

ISO/MPEG. "Information Technology—MPEG Audio Technologies—Part 3: Unified Speech and Audio Coding." ISO/IEC FDIS 23003-3:2011 (2011). 286 pages.

ISO/MPEG. "Proposed Revision of Audio Aspects of WD: Addition of Sample Aspect Ratio and further Audio Code-Points." ISO/IEC JCT1/SC29/WG11/N13855. Vienna, Austria (Jul. 2013). 7 pages.

Massberg, M. "Investigation in Dynamic Range Compression." MSC Project Report, Queen Mary University of London (Aug. 25, 2009). 66 pages.

Singer, et al. "Working Draft for Aspect Ratio Amendment to CICP." ISO/IEC/JTC1/SC29/WG11/N13595. Incheon, Korea (Apr. 2013). 6 pages.

Wang, et al. "Modified Discrete Cosine Transform—Its Implications for Audio Coding and Error Concealment." JAES, vol. 51, No. 1/2, Jan./Feb. 2003. 10 pages.

Baumgarte, et al. "Binaural Cue Coding—Part I: Psychoacoustic Fundamentals and Design Principles." IEE Transactions on Speech and Audio Processing, vol. 11, No. 6, pp. 509-519. Nov. 2003. 11 pages.

Faller et al. "Binaural Cue Coding—Part II: Schemes and Applications." IEE Transactions on Speech and Audio Processing, vol. 11, No. 6, pp. 520-531. Nov. 2003. 12 pages.

Kolundzija et al. "Design of a Compact Cylindrical Loudspeaker Array for Spatial Sound Reproduction." Audio Engineering Society, Convention Paper 8336, Presented at the 130th Convention, May 13-16, 2011. London, UK.

International Search Report and Written Opinion of the International Search Authority in International Application No. PCT/US2014/065295 dated Feb. 11, 2015. 10 pages.

\* cited by examiner

DYNAMIC RANGE AND PEAK CONTROL IN AUDIO USING NONLINEAR FILTERS

FIELD

A system and method are described for audio dynamic range compression using nonlinear filters, including edge-preserving smoothing filters used for image processing. Results show that the use of this class of filters results in superior compressed audio quality and permits more aggressive compression with less artifacts when compared with traditional compression techniques. Other embodiments are also described.

BACKGROUND

Most audio material comprises both louder and softer segments that define the material's dynamics and dynamic range. In many situations, such as listening in noisy environments or in a late-night scenario, it is desirable to reduce the dynamics and dynamic range to improve the listener experience. Several dynamic range compressors employ a time-varying gain factor to amplify soft segments and attenuate loud segments of the audio signal. When the loudness changes, the gain factor change is controlled by the compressor's attack and release time parameters. The parameters determine how fast the gain changes can be in response to increasing or decreasing loudness. The problem is that the gain change often does not match the loudness trajectory, and hence audible compressor artifacts such as "pumping" can occur.

"Pumping" artifacts are caused by a slowly rising gain factor that results in an audible loudness increase, especially in sections of the audio signal with static content. This effect cannot easily be avoided by lowering the release time parameter because a faster release can cause other modulation distortions due to the increased variations of the gain factor.

Ideally, the compression gain variations would be minimized to avoid artifacts. Hence, small loudness variations should not cause compression gain changes. Large loudness variations should only result in gain changes if loudness levels significantly change over a minimum period of time.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

SUMMARY

An audio encoding device is described herein. The audio encoding device includes a compressor that is based on a nonlinear filter. In particular, the nonlinear filter may be selected from the class of edge-preserving smoothing filters, which avoids common artifacts of conventional compressors. Edge-preserving smoothing filters have been used in image processing algorithms for their de-noising properties while preserving edges in the image. These properties are useful for audio compression because macro-dynamic loudness changes can be tracked precisely while micro-dynamic loudness changes can be ignored for the compression. Due to these advantages, more aggressive compression can be achieved with less distortion.

Compared with traditional compressors, the approach proposed here requires a larger look-ahead (i.e., compression using the above described edge-preserving smoothing filters will result in more delay of the processed audio signal). This may be a problem in some real-time applications, such as communications, but it is not a big issue in file-based processing or where content is produced offline. For offline content production, the compressor gain can be embedded in the content and it can be applied during playback if desired. This technique eliminates the impact of the compressor delay for playback.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments are described with reference to the appended drawings. While numerous details are set forth, it is understood that some embodiments of the invention may be practiced without these details. In other instances, well-known circuits, structures, and techniques have not been shown in detail so as not to obscure the understanding of this description.

Figure 1:
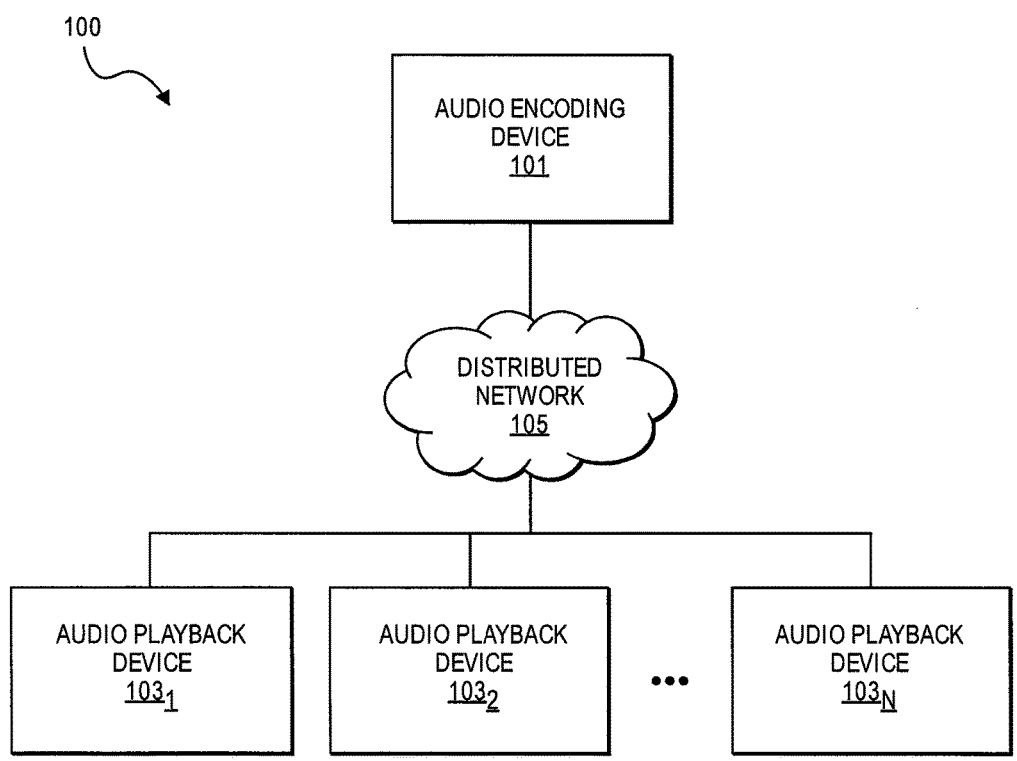
FIG. 1 shows an audio system, including an audio encoding device and a set of audio playback devices, according to one embodiment.

FIG. 1 shows an audio system 100 according to one embodiment. The audio system 100 may include an audio encoding device 101 and a set of audio playback devices $103_1$-$103_N$. The audio encoding device 101 and the audio playback devices $103_1$-$103_N$ may be communicatively coupled through the distributed network 105. In particular, the audio encoding device 101 may encode one or more pieces of sound program content in their entirety and transfer the encoded data to one or more of the audio playback devices $103_1$-$103_N$ over the distributed network 105 for later playback by the devices $103_1$-$103_N$ to associated users.

In one embodiment, the audio encoding device 101 may encode a piece of sound program content using one or more edge-preserving smoothing filters (i.e., a set of non-linear filters). Edge-preserving smoothing filters have been used in image processing algorithms for their de-noising properties while preserving edges in the image. These properties are useful for audio compression because macro-dynamic loudness changes can be tracked precisely while micro-dynamic loudness changes can be ignored for the compression. Due to these advantages, more aggressive compression can be achieved with less distortion.

Each element of the audio system 100 will now be described by way of example. In other embodiments, the audio system 100 may include more elements than those shown in FIG. 1 and described herein.

Figure 2:
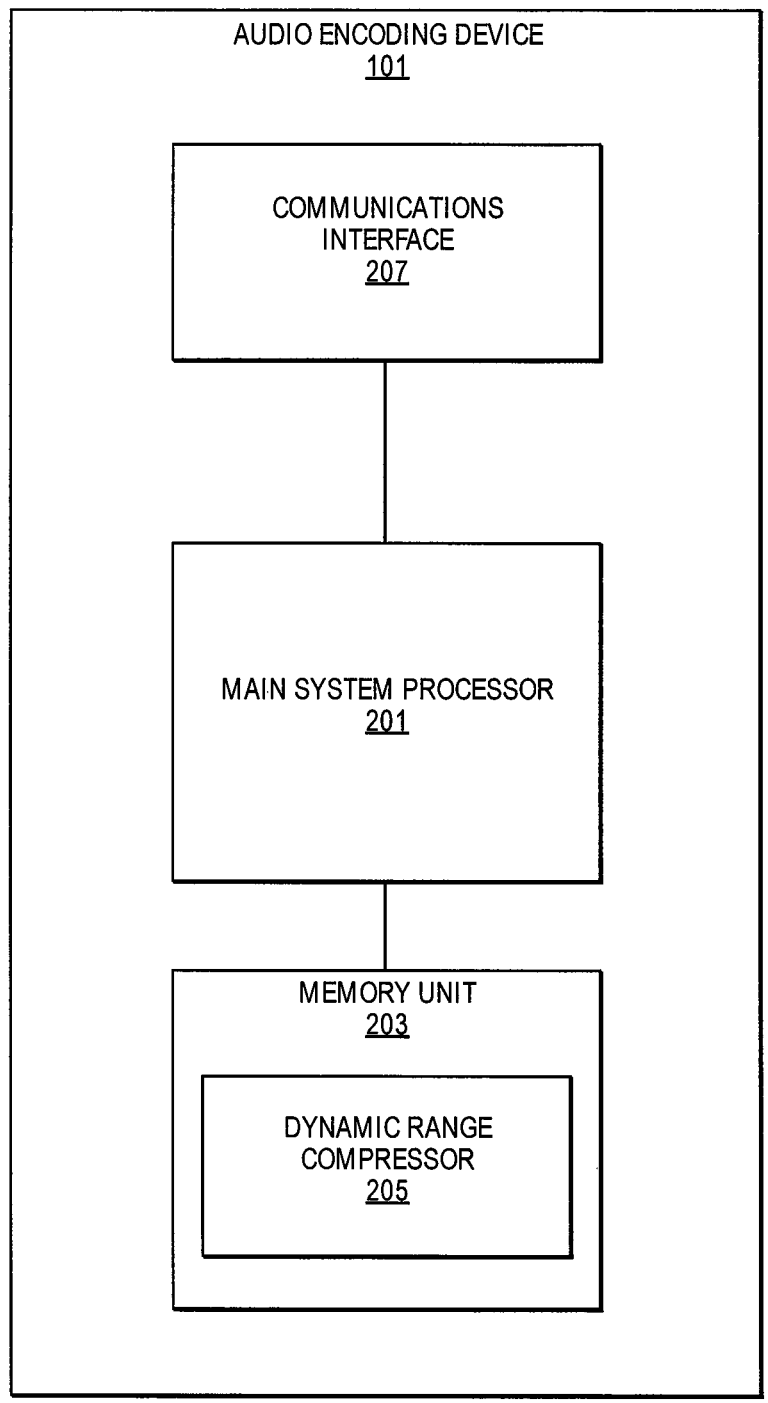
FIG. 2 shows a component diagram of the audio encoding device according to one embodiment.

FIG. 2 shows a component diagram of the audio encoding device 101 according to one embodiment. The audio encoding device 101 may be any computing device that is capable of encoding a piece of sound program content. For example, the audio encoding device 101 may be a laptop computer, a desktop computer, a computer server, a tablet computer, a gaming system, and/or a mobile device (e.g., cellular telephone or mobile media player). Each element of the audio encoding device 101 shown in FIG. 2 will now be described.

The audio encoding device 101 may include a main system processor 201 and a memory unit 203. The processor 201 and memory unit 203 are generically used here to refer to any suitable combination of programmable data processing components and data storage that conduct the operations needed to implement the various functions and operations of the audio encoding device 101. The processor 201 may be a special purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines) while the memory unit 203 may refer to microelectronic, non-volatile random access memory.

An operating system may be stored in the memory unit 203, along with application programs specific to the various functions of the audio encoding device 101, which are to be run or executed by the processor 201 to perform the various functions of the audio encoding device 101. For example, the memory unit 203 may include a dynamic range compressor 205, which, in conjunction with other hardware and software elements of the audio encoding device 101, encodes a piece of sound program content using one or more edge-preserving smoothing filters (i.e., a set of non-linear filters).

In one embodiment, the audio encoding device 101 may include a communications interface 207 for communicating with other components over one or more connections. For example, the communications interface 207 may be capable of communicating using Bluetooth, the IEEE 802.11x suite of standards, IEEE 802.3, cellular Global System for Mobile Communications (GSM) standards, cellular Code Division Multiple Access (CDMA) standards, and/or Long Term Evolution (LTE) standards. In one embodiment, the communications interface 207 facilitates the transmission/reception of video, audio, and/or other pieces of data over the distributed network 105. For example, the audio encoding device 101 may receive one or more pieces of sound program content to be encoded via the communications interface 207. As will be described in greater detail below, the pieces of sound program content may be encoded/processed and transmitted to one or more of the audio playback devices $103_1$-$103_N$ for playback also via the communications interface 207.

Figure 3:
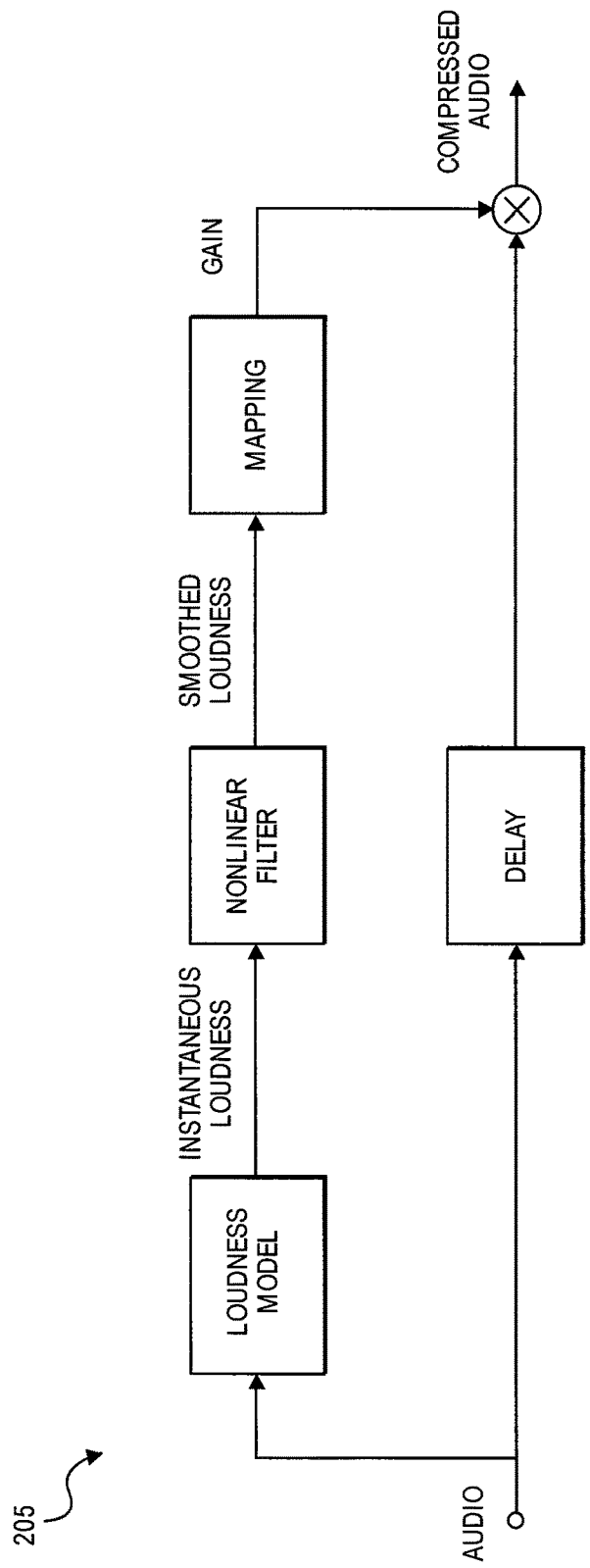
FIG. 3 shows a block diagram example of a dynamic range compressor which uses a nonlinear filter, according to one embodiment.

Returning to the compressor 205, FIG. 3 shows a block diagram example of the dynamic range compressor 205 according to one embodiment. The upper signal path in FIG. 3 is a side chain that computes dynamic range compression gain values for an input audio signal. The lower audio signal path includes an audio delay to compensate for the side chain delay and a multiplier to apply the compression gain values generated in the above side chain. Although described as applying dynamic range compression gain values using a multiplier of the compressor 205, in some embodiments the dynamic range compression gain values may be included as metadata of the uncompressed audio signal and transmitted to the audio playback devices $103_1$-$103_N$. In these embodiments, corresponding decoders in the audio playback devices $103_1$-$103_N$ may apply the dynamic range compression gain values to the audio signal based on a selection/preference of a user/listener. Accordingly, in these embodiments, the multiplier and application of dynamic range compression gain values is at the audio playback devices $103_1$-$103_N$ instead of at the audio encoding device 101. In some embodiments, multiple different sets of dynamic range compression gain values, which provide different compression effects, may be included as metadata for the uncompressed audio signal and selected by the user/listener for application at the audio playback devices $103_1$-$103_N$.

As shown, the side chain first estimates the instantaneous loudness of an input audio signal to be compressed using a loudness model. The result is proportional to a perceptual loudness scale (such as a sone scale); hence, it is approximately logarithmic. The primary nonlinear filter applies smoothing in areas where compression gain changes are not desired but keeps macro-dynamic loudness transitions unaffected. Afterwards, the smoothed loudness may be mapped to the compression gain using a primary mapping unit. In one embodiment, when the smoothed loudness is above a threshold value, the dynamic range compression gain value is at a first level and when the smoothed loudness is below a threshold value, the dynamic range compression gain value is at a second level, wherein the first level is below the second level. The mapping may be a memory-less input-output function. In particular, the mapping may constitute characteristics of the compressor (i.e., how much gain is applied at the various loudness levels). The mapping may also include the conversion from the logarithmic domain to the linear domain.

For audio signals with more than one audio channel, the compressor 205 may apply identical gains to all channels. The loudness model integrates the loudness of all channels into one output.

If multi-band dynamic range compression is desired, the audio signal in FIG. 3 represents just one of the several audio bands. In that case, a separate compressor 205 is applied to each sub-band of the audio signal. The sub-bands may thereafter be re-combined after compression.

Figure 4:
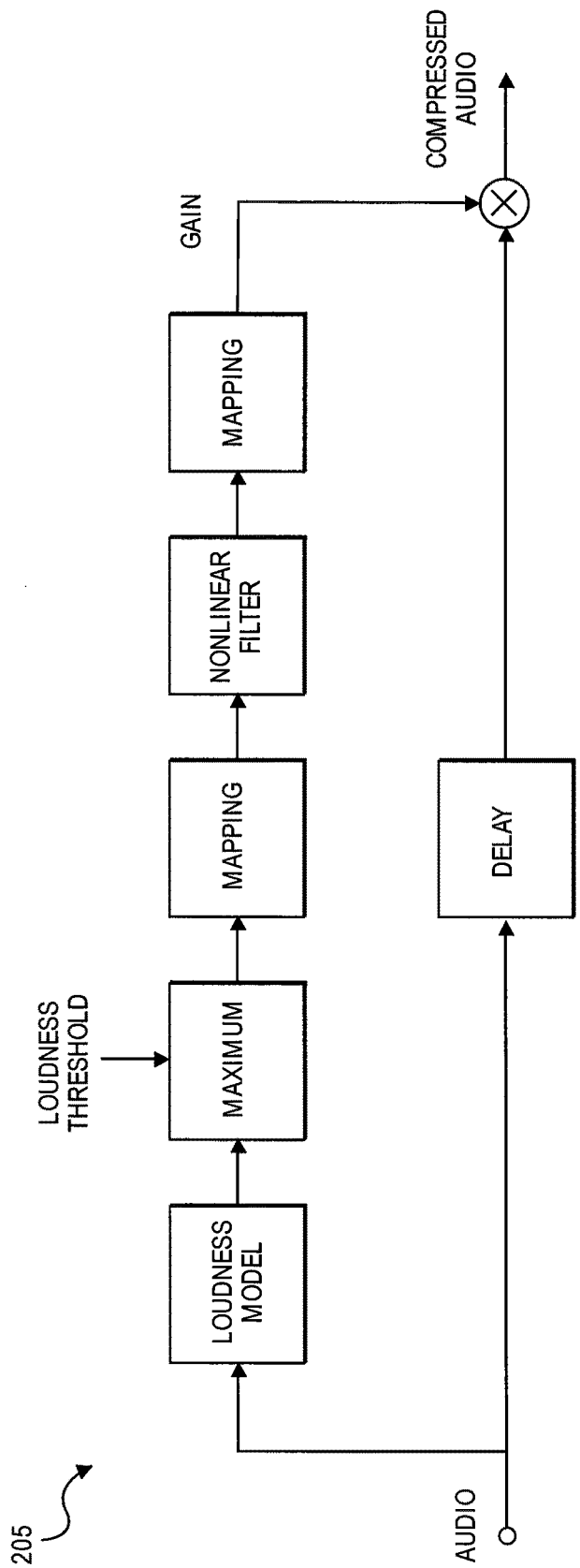
FIG. 4 shows a block diagram of a dynamic range compressor based on a nonlinear filter for peak control according to one embodiment.

The block diagram in FIG. 4 shows a dynamic range compressor 205 based on a nonlinear filter for controlling loudness peaks. Controlling loudness peaks can be a useful step for avoiding clipping of the audio signal if the signal exceeds full-scale. For peak control, the maximum of the instantaneous loudness and the maximum loudness threshold is derived using a maximum value unit and re-mapped using a secondary mapping unit before it enters the nonlinear filter. Therefore, loudness levels below the threshold will be ignored (i.e., not compressed) while loudness levels above the threshold may be reduced by the compressor 205.

As described above, the audio compressor 205 utilizes a nonlinear filter. In one embodiment, the nonlinear filter may be selected from the class of edge-preserving smoothing filters traditionally used for image processing. Since images have two dimensions, these image filters used here in the audio domain are modified to use only one dimension. This reduction to one dimension may be a simplification of the filters.

The following is a non-exhaustive list of nonlinear filters that can advantageously be applied to audio dynamic range compression: (1) median filter (order filter); (2) bilateral filter; (3) guided filter; (4) weighted least squares filter; and (5) anisotropic diffusion filter. The complexity associated with each of the filter types is different. Some filters offer more flexibility for parametric adjustments of the smoothing behavior than others. It is a matter of parameter tuning to achieve the best audio quality for the compressed audio output.

Figure 5:
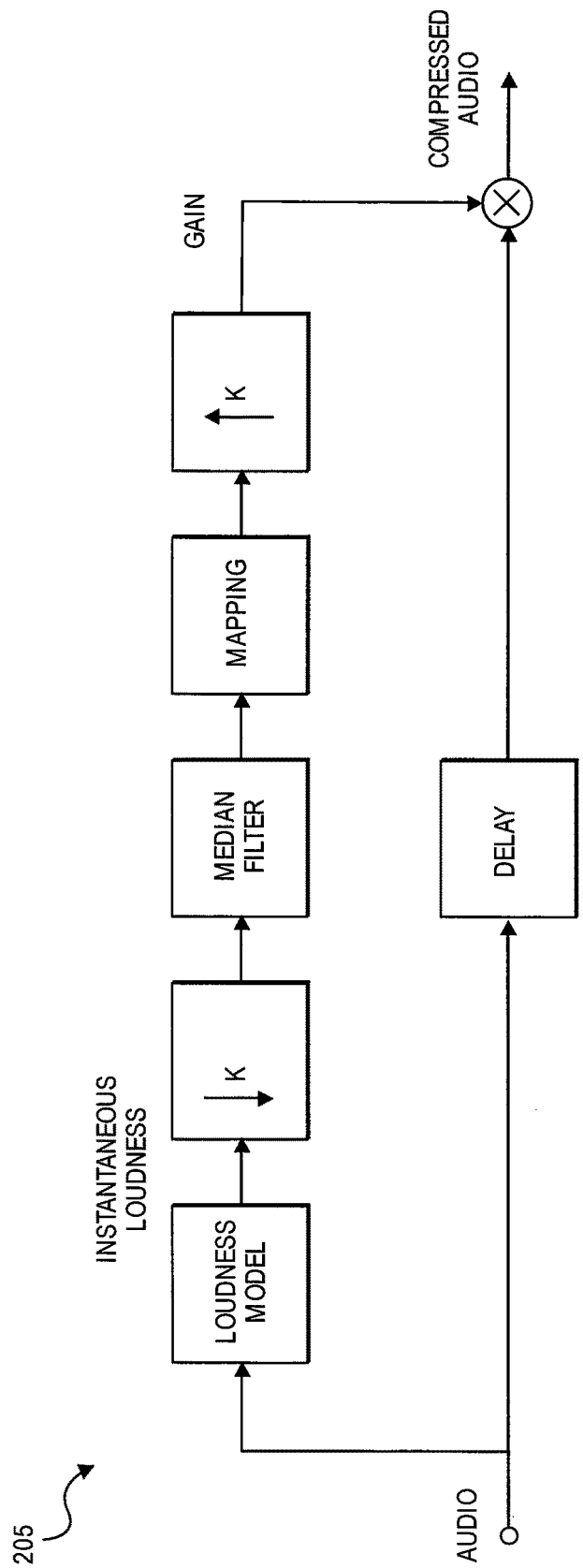
FIG. 5 is a block diagram showing the concept of a dynamic range compressor based on a median filter according to one embodiment.

FIG. 5 is a block diagram showing the concept of a dynamic range compressor 205 based on a median filter according to one embodiment. Similar to the compressors 205 shown in FIG. 3 and FIG. 4, the upper signal path consists of a side chain to compute the compression gain while the lower audio signal path includes an audio delay to compensate for the side chain delay and a multiplier to apply the compression gain.

In some embodiments, most parts of the side chain may be operated at a lower sample rate to save complexity (i.e., up-sampling and down-sampling using an up-sampling unit and a down-sampling unit). The sample interval may be between one and two milliseconds long to support sufficient time resolution.

The median filter may be a simple order filter or a histogram filter that works on a block of subsequent input samples and produces the median value of that block as a result. For the filter process of a continuous sequence of instantaneous loudness samples, the filter is applied to a block of samples, and with each output value, the block progresses by one input sample.

Figure 6:
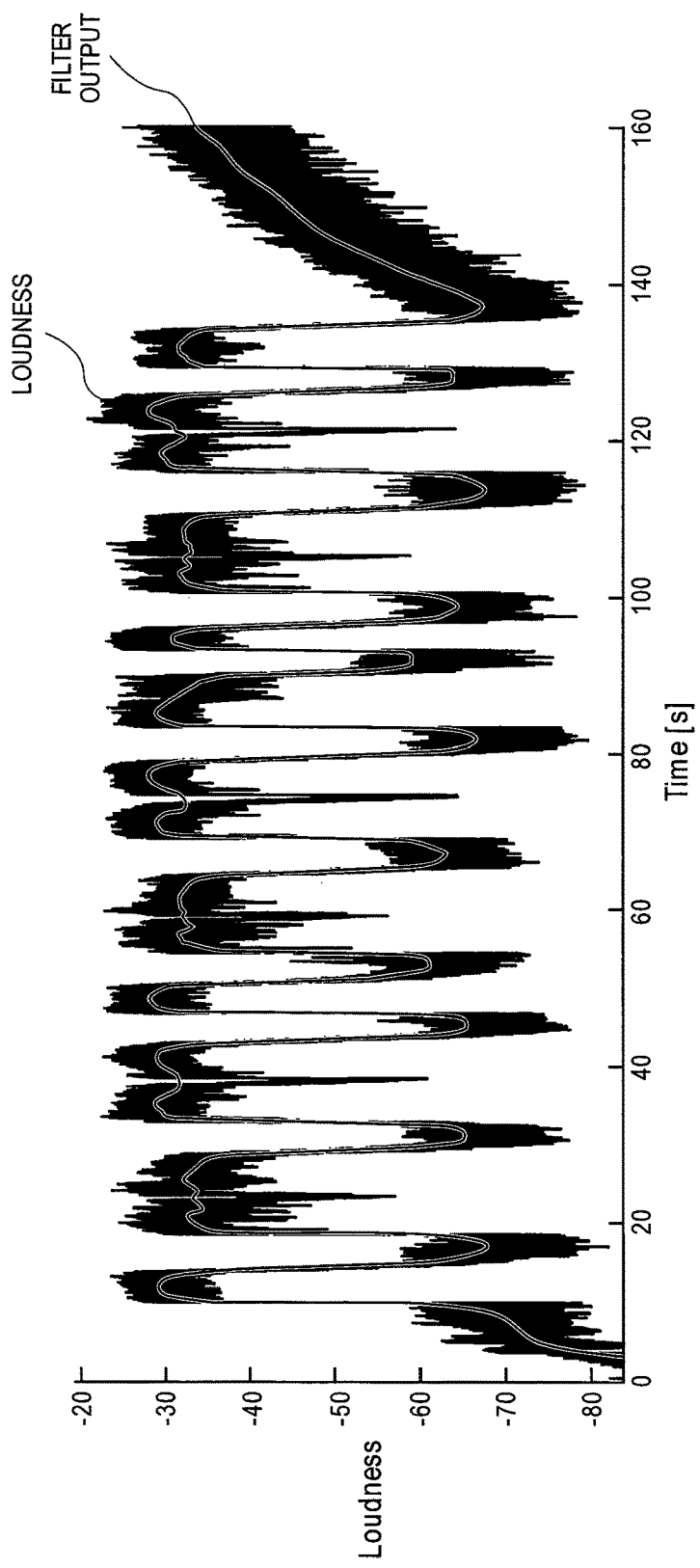
FIG. 6 shows loudness and median filter output of the first 160 seconds of a song according to one embodiment.
Figure 7:
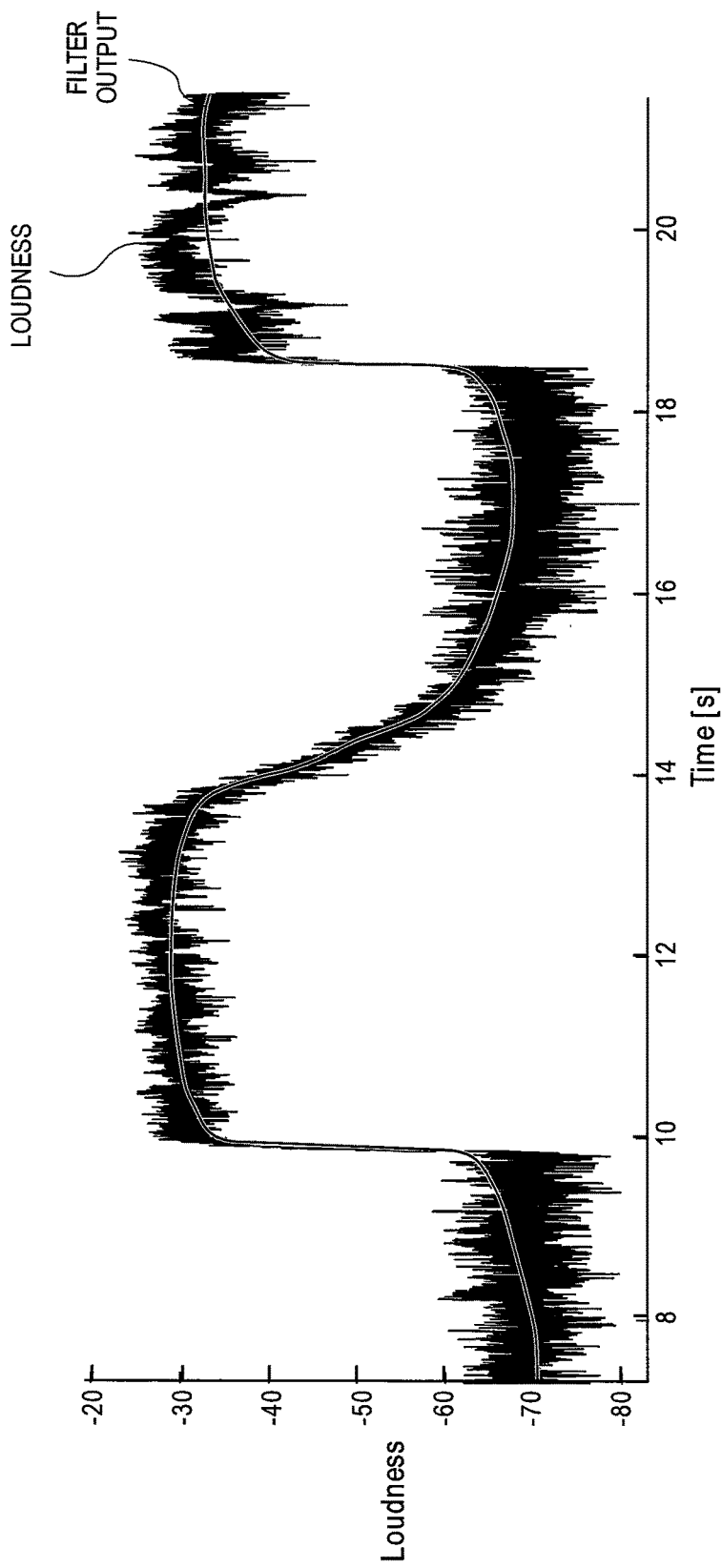
FIG. 7 shows a zoomed in portion of the chart of FIG. 6.

The instantaneous loudness and median filter output for the first 160 seconds of a piece of material with large dynamic range (i.e., a song) is shown in FIG. 6 and a zoomed-in excerpt is shown in FIG. 7. The song represented in FIGS. 6 and 7 exhibits alternating sections with acapella music and outdoor recordings at low level. Conventional compressors usually result in "pumping" artifacts due to the slow gain increase during the low-level sections.

Figure 8:
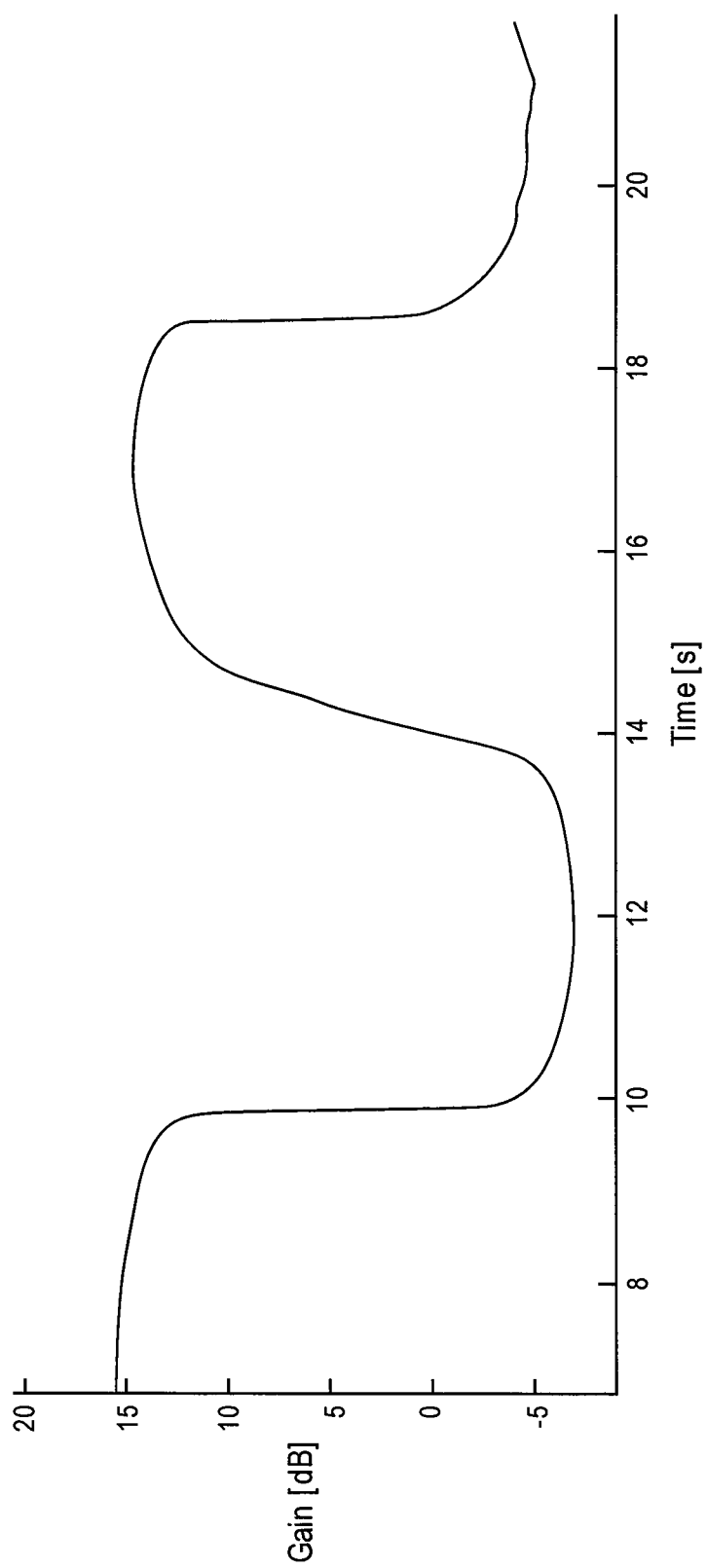
FIG. 8 shows compressor gain produced by a median filter based compressor according to one embodiment.

The compressor gain produced by the median filter based compressor 205 for the section/segment in FIG. 7 is shown in FIG. 8. It is evident in this representation that the gain curve has the same shape as the median filter output shown in FIG. 7 flipped upside down. Hence, there is no pumping effect since the gain varies at a similar or slower rate than the smoothed loudness.

Further, as shown in FIG. 8, the gain curve does not exhibit the fast fluctuations of the instantaneous loudness, as the median filter is efficiently smoothing the fluctuation while maintaining the sharp slopes of transitions between loud and soft sections. There is just one block size parameter that controls the minimum duration of a loud or soft section that the median filter will track. If the block size is twice the duration or larger, the median filter will start to smooth out (create less gain variation) for those sections.

Figure 9:
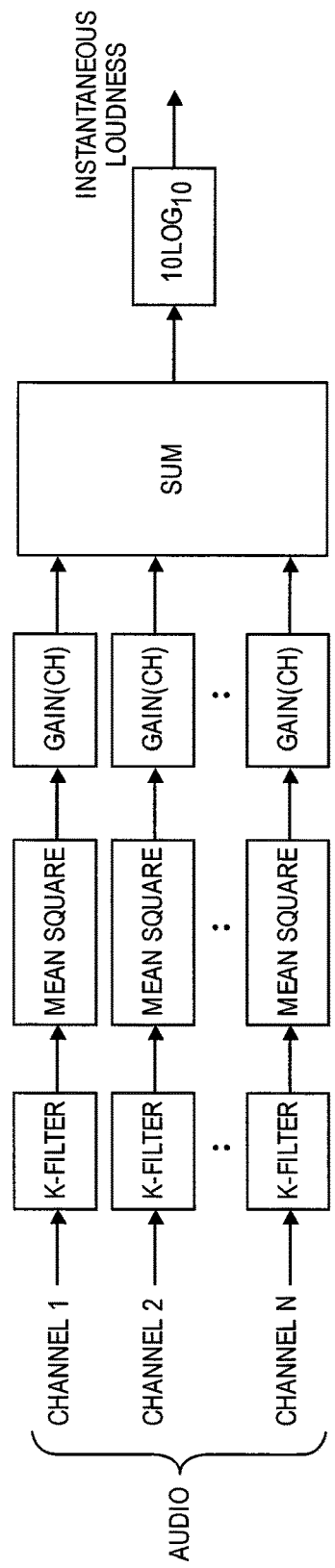
FIG. 9 shows a loudness model according to one embodiment.

The loudness model used to produce the results described above is shown in FIG. 9. The loudness model of FIG. 9 is based on the International Telecommunication Union Radiocommunication Sector (ITU-R) BS.1770-3 recommendation.

Figure 10:
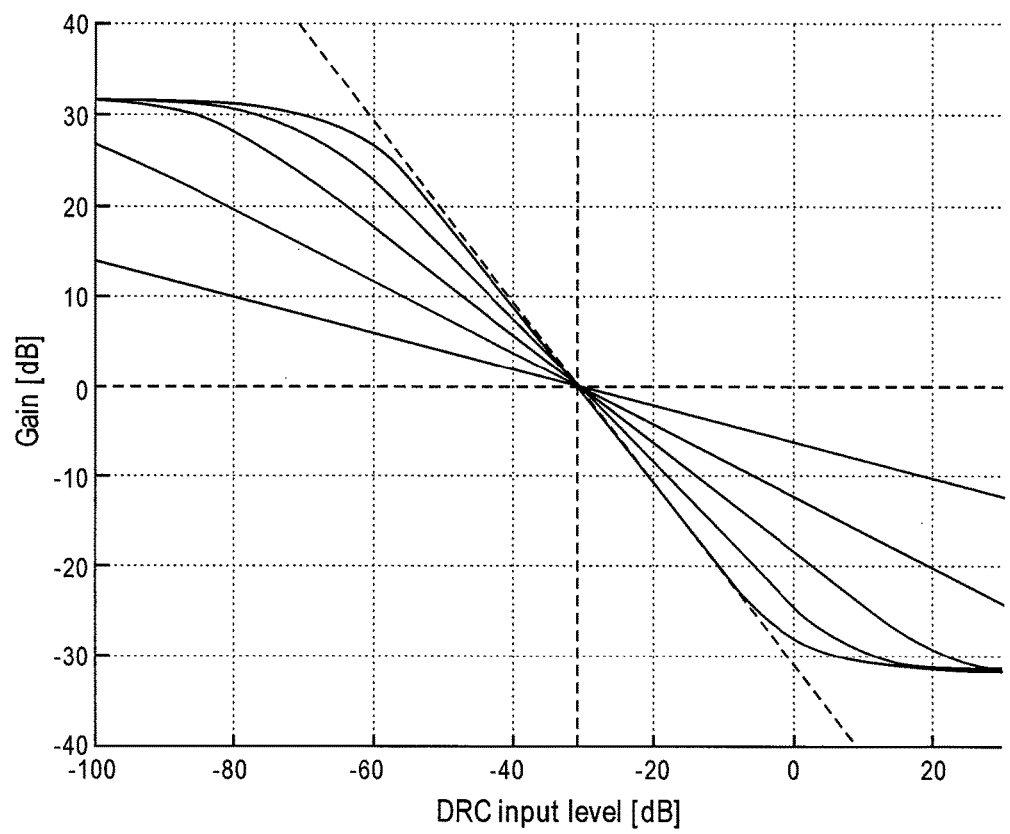
FIG. 10 shows several example mapping functions according to one embodiment.

Several examples for mapping functions are shown in FIG. 10. The characteristics for the mapping functions can be chosen according to the aggressiveness of compression. In some embodiments, it may be advantageous to normalize the audio signal to the same target loudness level as the mapping function before the signal enters the compressor 205. For example, the mapping functions may be normalized to −31 dB, which is the zero crossing point of all characteristics.

The approaches described above are based on a median filter with a constant filter size. Depending on the loudness fluctuations of the content, this may result in undesired gain changes as outlined in the following.

Figure 11:
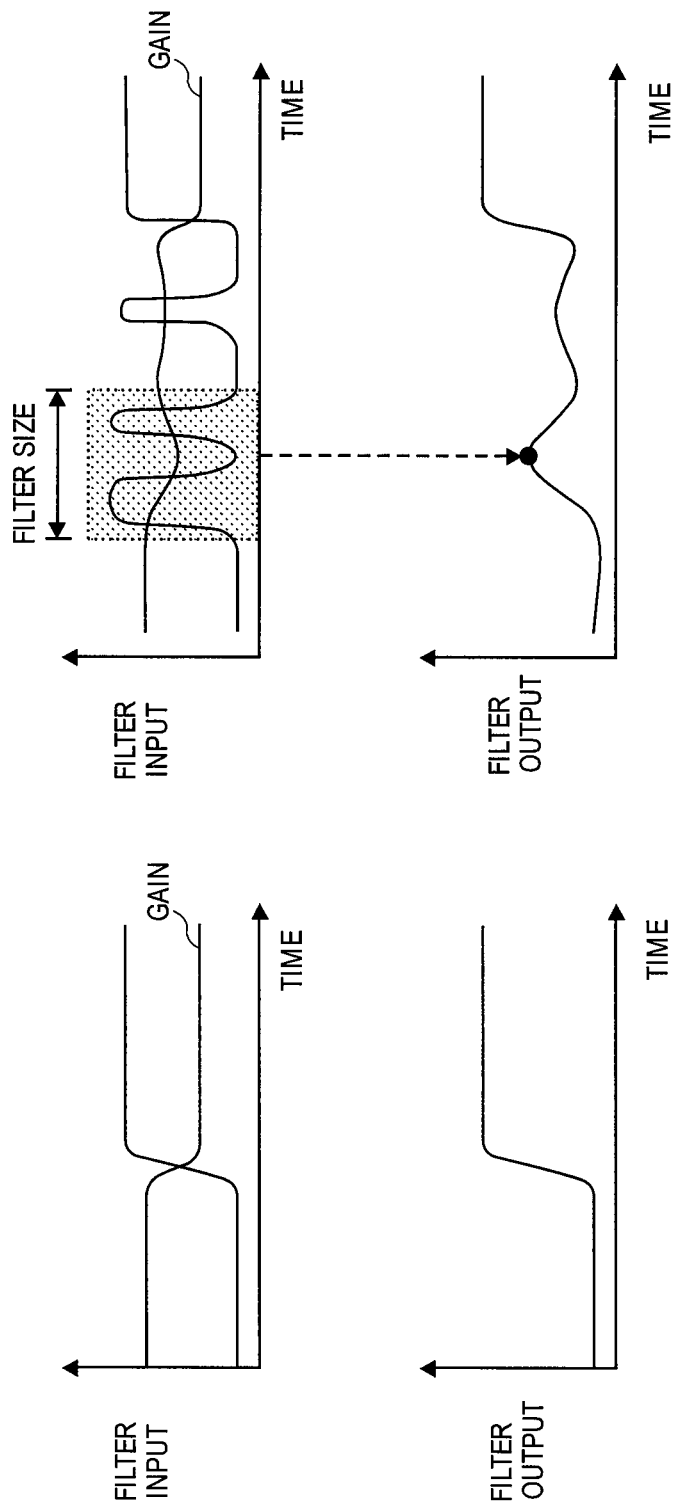
FIG. 11 shows examples of median filter input/output data and resulting dynamic range compression gain according to one embodiment.

The median filter process is based on the distribution of the filter input data within the current data block where the block size is equal to the filter size. If the distribution is bimodal (has two peaks) the filter output may change considerably when there are approximately the same number of data values under each of the peaks. This behavior is desired if there is a single transition from large to small values or vice versa within the data block, as shown in the left portion of FIG. 11. However, if there are multiple down and up transitions, undesired fluctuations of the filter output can occur as indicated in right portion of FIG. 11.

Figure 12:
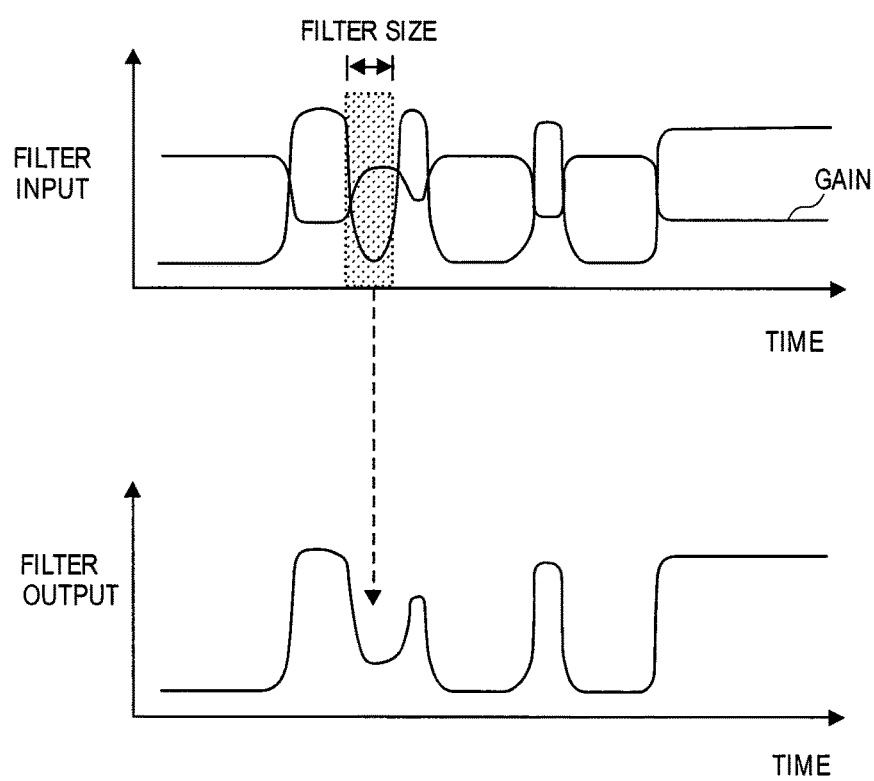
FIG. 12 shows examples of median filter input/output data and resulting dynamic range compression gain according to another embodiment.

The undesired fluctuations can be avoided by appropriate adaptation of the filter size. If a longer filter size is used, the filter output will be smoother. If a shorter filter size is used, the output will follow the input data more closely as shown in FIG. 12. To achieve a controlled behavior (i.e., to obtain either a smoothed or an output the follows closely the input), the size adaptation is controlled by measuring the duration of peaks and valleys before they enter the median filter.

If the duration is in a critical range, the filter size is automatically reduced for that section of input data. Otherwise, the standard/preconfigured filter size is used. The reduction and increase of the size is done by shrinking or growing the size of the filter in steps of two samples for each sampling period. This technique avoids possible glitches that could occur if the filter size is changed by a large fraction at once.

For the measurement of the peak and valley duration, median filter inputs are processed in parallel with a secondary median filter that is shorter than the first median filter. The output of the second median filter is a smoothed version of the input that preserves the transitions for peaks and valleys with a duration of half the filter size or less.

The output of the secondary median filter is then processed by the adaptation controller, which measures duration. This may be done by running a maximum and minimum follower with a release time constant (for example, 1.5 seconds). The duration is then measured by observing the interval between crossings of the minimum or maximum follower with the input signal of the controller.

Figure 13:
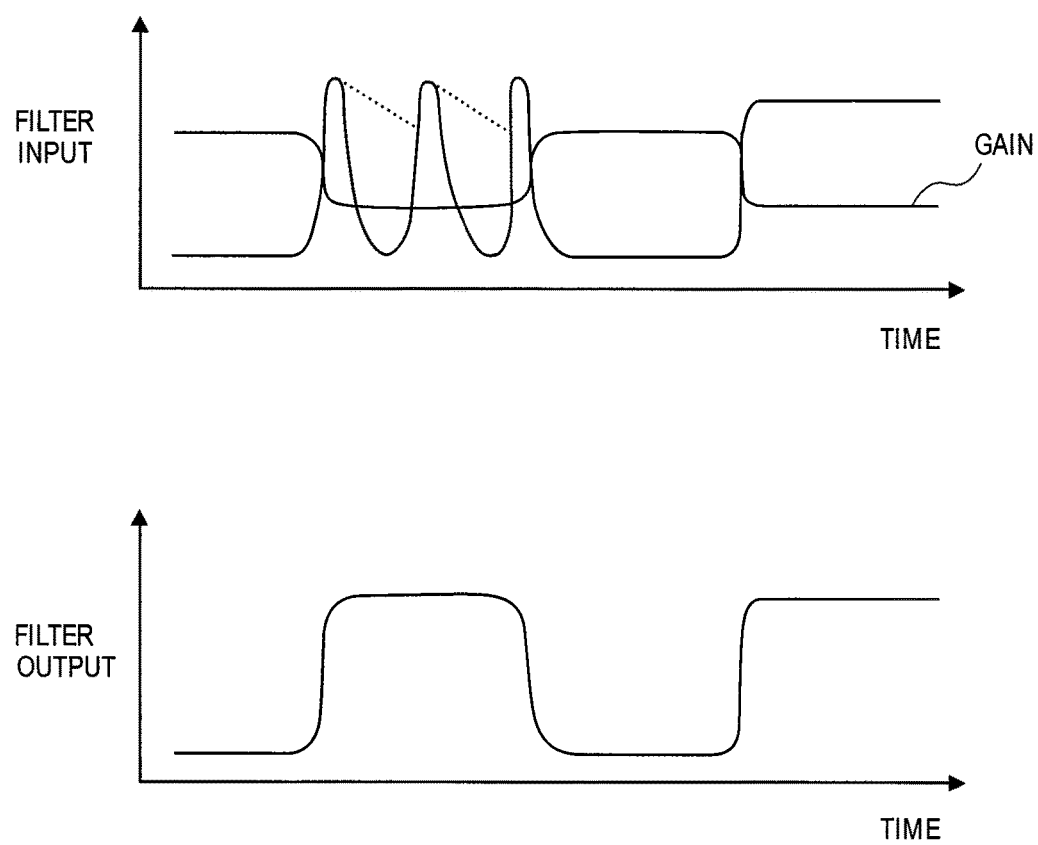
FIG. 13 shows an example decay generator input and output and resulting DRC gain (upper diagram) and the corresponding median filter output (lower diagram) according to another embodiment.

Even with the adaptive filter size reduction, short loudness peaks can still be ignored by the median filter, i.e., they have no noticeable effect on the output because they are shorter than half the filter size. This is problematic if there are bursts of short peaks, because the bursts result in a rather loud sound if not controlled by the DRC. To avoid this problem, there is a preprocessor applied to the median filter input, which is called a decay generator. The decay generator adds a slower decay to short peaks, which effectively makes them longer. If a valley between two peaks is longer than a threshold, the decay is not added. FIG. 13 shows an example decay generator input and output and resulting DRC gain (upper diagram) and the corresponding median filter output (lower diagram).

The duration of the valley may be measured as the time between crossings of the decay curve and the controller input signal. The threshold for the valley duration may be dynamically adjusted by the adaptation controller as well.

Figure 14:
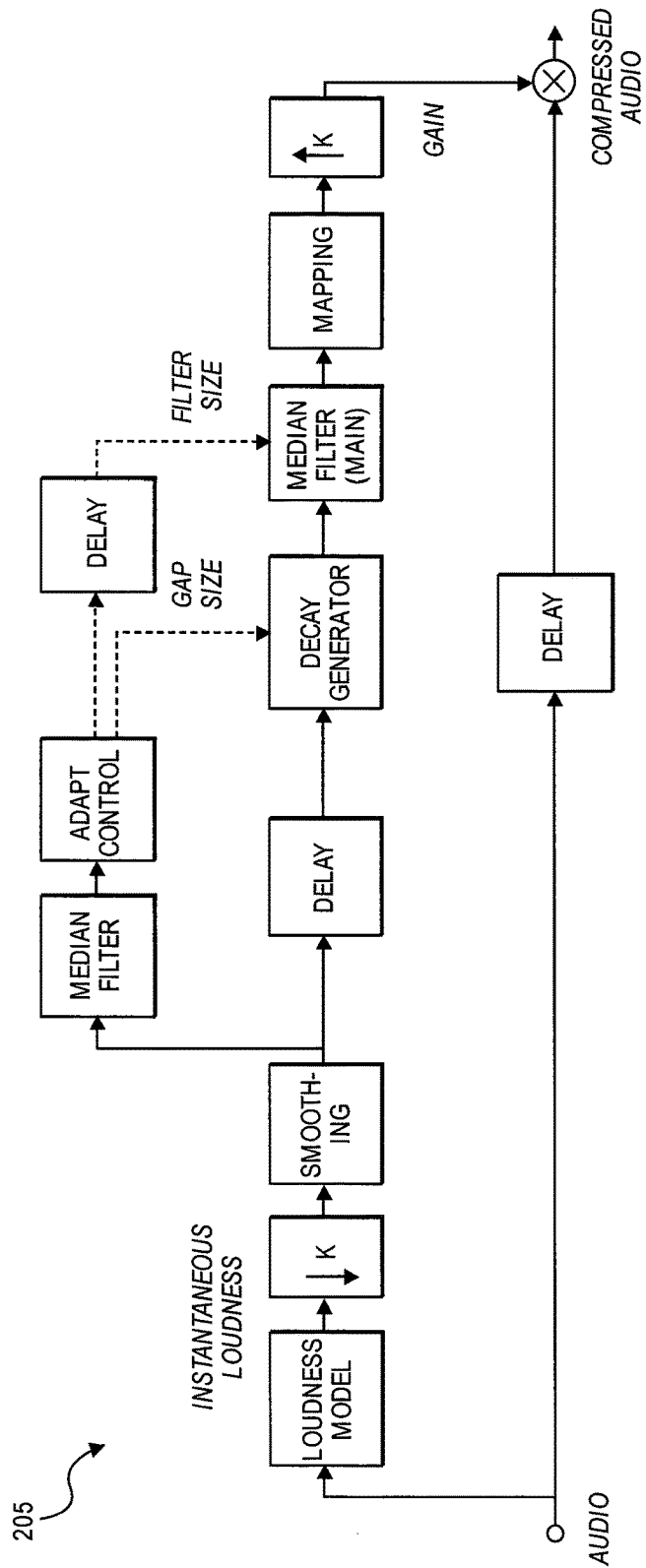
FIG. 14 shows the complete compressor with adaptation according to another embodiment.

The block diagram of FIG. 14 shows the complete compressor with adaptation. Various delay blocks are present to compensate for the latency of parallel paths. After the loudness block, a smoothing block was added (moving average) to smooth out extremely short maxima and minima that can be ignored for loudness control.

Figure 15:
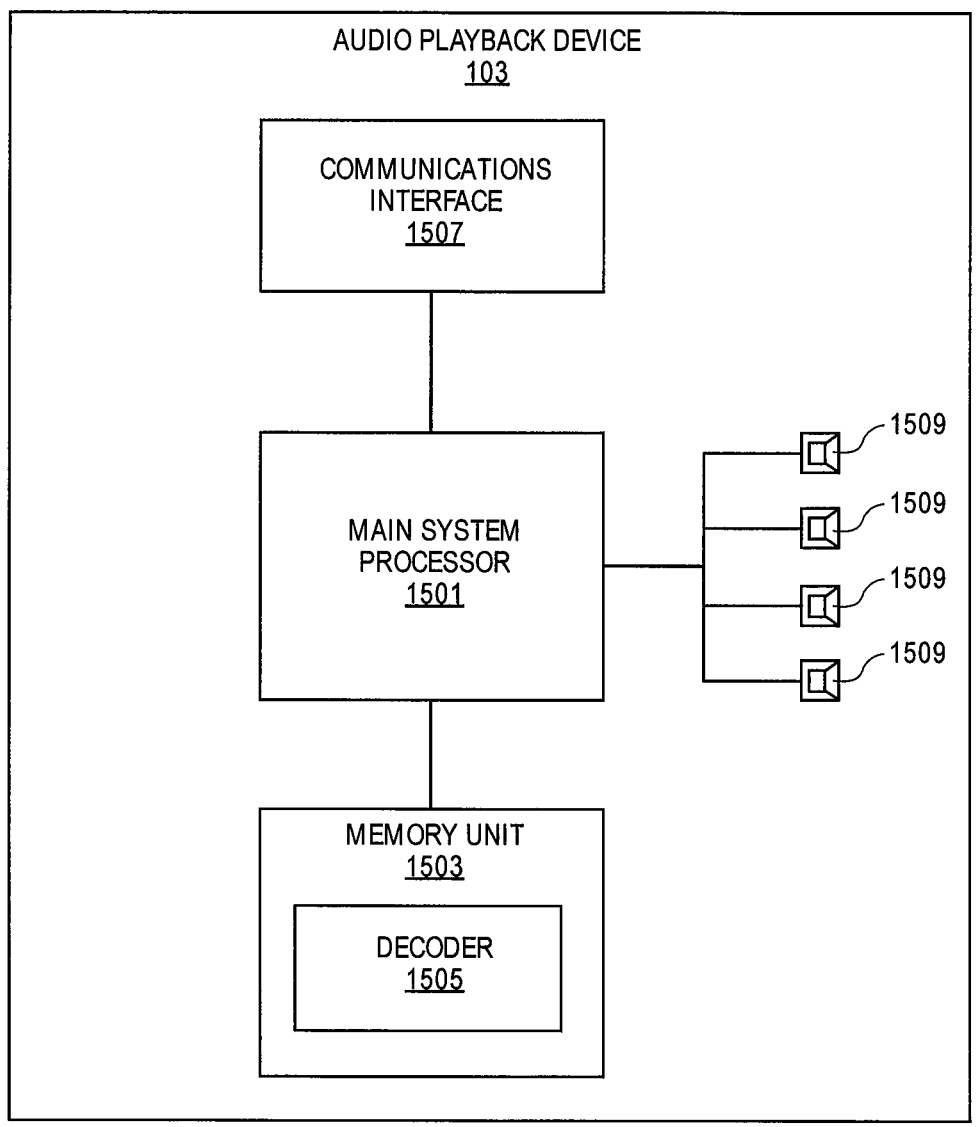
FIG. 15 shows a component diagram of the audio playback device according to one embodiment.

Following the processing of the input audio signal using the compressor 205, the audio encoding device 101 may transmit or otherwise distribute the compressed audio signal to one or more of the audio playback devices $103_1$-$103_N$. For example, the audio encoding device 101 may distribute the compressed audio signal via the distributed network 105 for playback by the devices $103_1$-$103_N$ to associated users. The audio playback devices $103_1$-$103_N$ may be similarly configured in comparison to the audio encoding device 101. In particular, as shown in FIG. 15, the audio playback devices $103_1$-$103_N$ may each include a main system processor 1501, a memory unit 1503, and a communications interface 1507 that are respectively similar or identical to the main system processor 201, the memory unit 203, and the communications interface 207 of the audio encoding device 101.

In one embodiment, each of the audio playback devices $103_1$-$103_N$ may include one or more loudspeakers 1509 for outputting sound based on the encoded piece of sound program content received from the audio encoding device 101. The loudspeakers 1509 may be any combination of full-range drivers, mid-range drivers, subwoofers, woofers, and tweeters. Each of the loudspeakers 1509 may use a lightweight diaphragm, or cone, connected to a rigid basket, or frame, via a flexible suspension that constrains a coil of wire (e.g., a voice coil) to move axially through a cylindrical magnetic gap. When an electrical audio signal is applied to the voice coil, a magnetic field is created by the electric current in the voice coil, making it a variable electromagnet. The coil and the loudspeakers' 1509 magnetic system interact, generating a mechanical force that causes the coil (and thus, the attached cone) to move back and forth, thereby reproducing sound under the control of the applied electrical audio signal coming from a source. In one embodiment, the audio playback devices $103_1$-$103_N$ may include a decoder 1505 for processing the compressed audio signal for playback using the loudspeakers 1509.

As mentioned above, although described as applying dynamic range compression gain values using a multiplier of the compressor 205, in some embodiments the dynamic range compression gain values may be included as metadata of the uncompressed audio signal and transmitted to the audio playback devices $103_1$-$103_N$. In these embodiments, corresponding decoders 1505 in the audio playback devices $103_1$-$103_N$ may apply the dynamic range compression gain values to the audio signal based on a selection/preference of a user/listener. Accordingly, in these embodiments, the multiplier and application of dynamic range compression gain values is at the audio playback devices $103_1$-$103_N$ instead of at the audio encoding device 101. In some embodiments, multiple different sets of dynamic range compression gain values, which provide different compression effects, may be included as metadata for the uncompressed audio signal and selected by the user/listener for application at the audio playback devices $103_1$-$103_N$.

As described above, systems and method for audio dynamic range compression have been proposed based on nonlinear filters that are usually applied in image processing for edge-preserving smoothing. Results show that the use of this class of filters results in superior compressed audio quality and permits more aggressive compression with less artifacts when compared with traditional compressors.

Although the nonlinear filter output described above preserves transitions between loud and soft sections, this property may be used for segmenting/classifying the audio signal, where each segment has a more or less constant compressor gain. Accordingly, instead of just using a mapping function (characteristic) to generate the compressor gain from the nonlinear filter output, the content of each segment may be analyzed independently and the compressor gain dependent on the result may be modified appropriately. For instance, if a segment only contains microphone noise, the gain may be minimized, but if a segment contains speech, the gain may be amplified to a level that is intelligible.

As a practical example, the segmentation could be done by evaluating the local extrema of the time-derivative of the nonlinear filter output. The extrema indicate where the maximum slope steepness is reached. If the magnitude of the steepness exceeds a certain threshold, it indicates a boundary between two segments.

As explained above, an embodiment of the invention may be an article of manufacture in which a machine-readable medium (such as microelectronic memory) has stored thereon instructions which program one or more data processing components (generically referred to here as a "processor") to perform the operations described above. In other embodiments, some of these operations might be performed by specific hardware components that contain hardwired logic (e.g., dedicated digital filter blocks and state machines). Those operations might alternatively be performed by any combination of programmed data processing components and fixed hardwired circuit components.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

What is claimed is:

1. A method for encoding an audio signal, comprising:
   processing samples of the audio signal using a loudness model to determine the instantaneous loudness of the audio signal for a set of the samples;
   processing the instantaneous loudness using a primary nonlinear filter to generate a smoothed loudness wherein the primary nonlinear filter performs a time domain-only filter process upon a continuous sequence of instantaneous loudness samples to generate the smooth loudness;
mapping the smoothed loudness to a dynamic range compression gain; and
combining the dynamic range compression gain with the audio signal to generate a compressed audio signal.

2. The method of claim 1, wherein the primary nonlinear filter is an edge-preserving smoothing filter.

3. The method of claim 1, wherein the primary nonlinear filter is one of (1) a median filter; (2) a bilateral filter; (3) a guided filter; (4) a weighted least squares filter; and (5) an anisotropic diffusion filter.

4. The method of claim 1, wherein when the smoothed loudness is above a threshold value, the dynamic range compression gain is set at a first level and when the smoothed loudness is below the threshold value, the dynamic range compression gain is set at a second level, wherein the first level is below the second level.

5. The method of claim 1, further comprising:
(1) limiting the instantaneous loudness to a maximum loudness threshold value and (2) distorting the limited instantaneous loudness using a mapping function wherein processing the instantaneous loudness using the primary nonlinear filter comprises processing the distorted and limited instantaneous loudness.

6. The method of claim 1, further comprising:
down-sampling the instantaneous loudness prior to processing by the primary nonlinear filter; and
up-sampling the dynamic range compression gain prior to combination with the audio signal.

7. The method of claim 1, wherein the primary nonlinear filter is a median filter, the method further comprising:
evaluating a local extremum of a time-derivative of the smoothed loudness to classify the audio signal into separate content segments, wherein the extremum indicates where a maximum slope steepness is reached, wherein a boundary between two segments is indicated when a magnitude of a steepness of the time-derivative of the smoothed loudness exceeds a steepness threshold.

8. The method of claim 1, further comprising:
processing the instantaneous loudness using a secondary nonlinear filter and an adaptation controller to determine a duration of a peaks or a valley in the instantaneous loudness;
reducing a size of the primary nonlinear filter when the determined duration is below a filter threshold; and
slowing decay to the instantaneous loudness when the determined duration is below a decay threshold.

9. The method of claim 8, wherein the secondary nonlinear filter is a median filter.

10. An audio encoding device for encoding an audio signal, comprising:
a loudness model to process samples of the audio signal to determine the instantaneous loudness of the audio signal for a set of the samples;
a primary nonlinear filter to process the instantaneous loudness to generate a smoothed loudness wherein the primary nonlinear filter performs a time domain-only filter process upon a continuous sequence of instantaneous loudness samples to generate the smooth loudness; and
a primary mapping unit to map the smoothed loudness to a dynamic range compression gain.

11. The audio encoding device of claim 10, further comprising:
a multiplier to combine the dynamic range compression gain with the audio signal to generate a compressed audio signal.

12. The audio encoding device of claim 10, wherein the dynamic range compression gain is added as metadata to the audio signal before being transmitted to an audio playback device.

13. The audio encoding device of claim 10, wherein the primary nonlinear filter is an edge-preserving smoothing filter.

14. The audio encoding device of claim 10, wherein the primary nonlinear filter is one of (1) a median filter; (2) a bilateral filter; (3) a guided filter; (4) a weighted least squares filter; and (5) an anisotropic diffusion filter.

15. The audio encoding device of claim 10, wherein when the smoothed loudness is above a threshold value, the dynamic range compression gain is set at a first level and when the smoothed loudness is below the threshold value, the dynamic range compression gain is set at a second level, wherein the first level is below the second level.

16. The audio encoding device of claim 11, further comprising:
a maximum value unit to reduce peaks in the compressed audio signal by limiting the instantaneous loudness to a maximum loudness threshold value.

17. The audio encoding device of claim 10, further comprising:
a down-sampling unit to down-sample the instantaneous loudness prior to processing by the primary nonlinear filter; and
an up-sampling unit to up-sample the output of the primary mapping unit that produces the dynamic range compression gain.

18. The audio encoding device of claim 10, further comprising:
a secondary nonlinear filter and an adaptation controller to (1) process the instantaneous loudness to determine a duration of a peak or a valley in the instantaneous loudness and (2) reduce size of the primary nonlinear filter when the determined duration is below a filter threshold; and
a decay generator to slow decay to the instantaneous loudness when the determined duration is below a decay threshold.

19. The audio encoding device of claim 18, wherein the secondary nonlinear filter is a median filter.

20. A non-transitory computer readable medium that stores instructions that when executed by a processor of an audio encoding device cause the audio encoding device to:
process samples of an audio signal using a loudness model to determine the instantaneous loudness of the audio signal for a set of the samples;
process the instantaneous loudness using a primary nonlinear filter to generate a smoothed loudness wherein the primary nonlinear filter performs a time domain-only filter process upon a continuous sequence of instantaneous loudness sample to generate the smooth loudness;
map the smoothed loudness to a dynamic range compression gain; and
combine the dynamic range compression gain with the audio signal to generate a compressed audio signal.

21. The non-transitory computer readable medium of claim 20, wherein the computer readable medium stores further instructions that when executed by the processor of the audio encoding device cause the audio encoding device to:

process the instantaneous loudness using a secondary nonlinear filter and an adaptation controller to determine a duration of a peak or a valley in the instantaneous loudness; and slow decay to the instantaneous loudness when the determined duration is below a decay threshold.

22. The non-transitory computer readable medium of claim 20, wherein the computer readable medium stores further instructions that when executed by the processor of the audio encoding device cause the audio encoding device to:

add the dynamic range compression gain as metadata to the audio signal.

23. The non-transitory computer readable medium of claim 20, wherein the nonlinear filter is an edge-preserving smoothing filter.

24. The non-transitory computer readable medium of claim 20, wherein the nonlinear filter is one of (1) a median filter; (2) a bilateral filter; (3) a guided filter; (4) a weighted least squares filter; and (5) an anisotropic diffusion filter.

* * * * *